US010965289B2

(12) United States Patent
Sahu et al.

(10) Patent No.: US 10,965,289 B2
(45) Date of Patent: Mar. 30, 2021

(54) METAL OXIDE SEMICONDUCTOR DEVICE OF AN INTEGRATED CIRCUIT

(71) Applicant: QUALCOMM Incorporated, San Diego, CA (US)

(72) Inventors: Satyanarayana Sahu, San Diego, CA (US); Xiangdong Chen, San Diego, CA (US); Venugopal Boynapalli, San Marcos, CA (US); Hyeokjin Lim, San Diego, CA (US); Mickael Malabry, San Diego, CA (US); Mukul Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/267,289

(22) Filed: Feb. 4, 2019

(65) Prior Publication Data

US 2019/0173473 A1   Jun. 6, 2019

Related U.S. Application Data

(62) Division of application No. 15/393,180, filed on Dec. 28, 2016, now Pat. No. 10,236,886.

(51) Int. Cl.
*H03K 19/0948* (2006.01)
*H01L 27/118* (2006.01)
(Continued)

(52) U.S. Cl.
CPC ....... *H03K 19/0948* (2013.01); *H01L 23/522* (2013.01); *H01L 23/528* (2013.01);
(Continued)

(58) Field of Classification Search
CPC ............ H03K 19/0948; H01L 23/5226; H01L 27/0207; H01L 23/528; H01L 27/11807;
(Continued)

(56) References Cited

U.S. PATENT DOCUMENTS 5,898,194 A   4/1999   Gheewala
6,713,886 B2  3/2004   Kumagai et al.
(Continued)

FOREIGN PATENT DOCUMENTS

| CN | 104716087 A | 6/2015 |
|----|-------------|--------|
| CN | 106206418 A | 12/2016 |
| JP | H0922945 A  | 1/1997 |

OTHER PUBLICATIONS

International Search Report and Written Opinion—PCT/US2017/065429—ISA/EPO—dated Mar. 22, 2018 (163931WO).

*Primary Examiner* — Laura M Menz
*Assistant Examiner* — Candice Chan
(74) *Attorney, Agent, or Firm* — Qualcomm Incorporated

(57) ABSTRACT

A MOS device of an IC includes pMOS and nMOS transistors. The MOS device further includes a first $M_x$ layer interconnect extending in a first direction and coupling the pMOS and nMOS transistor drains together, and a second $M_x$ layer interconnect extending in the first direction and coupling the pMOS and nMOS transistor drains together. The first and second $M_x$ layer interconnects are parallel. The MOS device further includes a first $M_{x+1}$ layer interconnect extending in a second direction orthogonal to the first direction. The first $M_{x+1}$ layer interconnect is coupled to the first $M_x$ layer interconnect and the second $M_x$ layer interconnect. The MOS device further includes a second $M_{x+1}$ layer interconnect extending in the second direction. The second $M_{x+1}$ layer interconnect is coupled to the first $M_x$ layer interconnect and the second $M_x$ layer interconnect. The second $M_{x+1}$ layer interconnect is parallel to the first $M_{x+1}$ layer interconnect.

8 Claims, 7 Drawing Sheets

(51) Int. Cl.
*H01L 23/528* (2006.01)
*H01L 27/02* (2006.01)
*H01L 23/522* (2006.01)
*H01L 27/092* (2006.01)

(52) U.S. Cl.
CPC ...... *H01L 23/5226* (2013.01); *H01L 27/0207* (2013.01); *H01L 27/11807* (2013.01); *H01L 27/0924* (2013.01); *H01L 2027/11853* (2013.01); *H01L 2027/11875* (2013.01); *H01L 2027/11887* (2013.01); *H01L 2027/11888* (2013.01)

(58) Field of Classification Search
CPC ....... H01L 27/0924; H01L 2027/11888; H01L 2027/11887; H01L 2027/11853; H01L 2027/11875; H01L 23/522
See application file for complete search history.

(56) References Cited

U.S. PATENT DOCUMENTS

| | | |
|---|---|---|
| 8,063,415 B2 | 11/2011 | Tsuda |
| 8,762,911 B1 | 6/2014 | Lu et al. |
| 9,292,644 B2 | 3/2016 | Loh et al. |
| 9,577,639 B1 | 2/2017 | Sahu et al. |
| 2007/0063288 A1 | 3/2007 | Furuta et al. |
| 2008/0169487 A1 | 7/2008 | Shimbo et al. |
| 2011/0252392 A1 | 10/2011 | Saika |
| 2013/0026572 A1 | 1/2013 | Kawa et al. |
| 2013/0334576 A1 | 12/2013 | Park et al. |
| 2014/0195997 A1 | 7/2014 | Tseng et al. |
| 2015/0054568 A1 | 2/2015 | Rasouli et al. |
| 2018/0183439 A1 | 6/2018 | Sahu et al. |

METAL OXIDE SEMICONDUCTOR DEVICE OF AN INTEGRATED CIRCUIT

CROSS-REFERENCE TO RELATED APPLICATION(S)

This application is a divisional application of U.S. patent application Ser. No. 15/393,180 entitled "MULTIPLE VIA STRUCTURE FOR HIGH PERFORMANCE STANDARD CELLS", and filed on Dec. 28, 2016, which is expressly incorporated by reference herein in its entirety.

BACKGROUND

Field

The present disclosure relates generally to a standard cell architecture, and more particularly, to a multiple via structure for high performance standard cells.

Background

A standard cell device is an integrated circuit (IC) that implements digital logic. An application-specific IC (ASIC), such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or a fin FETs (FinFETs)) and connect the transistors into circuits.

Interconnect resistance is very high in the 7 nm node and smaller manufacturing processes. There is currently a need for improvements in the design of standard cells that address the higher interconnect resistance.

SUMMARY

In an aspect of the disclosure, a metal oxide semiconductor (MOS) device of an IC includes a plurality of p-type MOS (pMOS) transistors, each having a pMOS transistor gate, a pMOS transistor drain, and a pMOS transistor source. Each pMOS transistor gate extends in a first direction. The MOS device further includes a plurality of n-type MOS (nMOS) transistors, each having an nMOS transistor gate, an nMOS transistor drain, and an nMOS transistor source. Each nMOS transistor gate extends in the first direction. Each nMOS transistor gate is formed with a corresponding pMOS transistor gate by a same gate interconnect extending in the first direction. The MOS device further includes a first metal x ($M_x$) layer interconnect extending in the first direction and coupling the pMOS transistor drains to the nMOS transistor drains. The MOS device further includes a second $M_x$ layer interconnect extending in the first direction and coupling the pMOS transistor drains to the nMOS transistor drains. The second $M_x$ layer interconnect is parallel to the first $M_x$ layer interconnect. The MOS device further includes a first metal x+1 ($M_{x+1}$) layer interconnect extending in a second direction orthogonal to the first direction. The first $M_{x+1}$ layer interconnect is coupled to the first $M_x$ layer interconnect and the second $M_x$ layer interconnect. The MOS device further includes a second $M_{x+1}$ layer interconnect extending in the second direction. The second $M_{x+1}$ layer interconnect is coupled to the first $M_x$ layer interconnect and the second $M_x$ layer interconnect. The second $M_{x+1}$ layer interconnect is parallel to the first $M_{x+1}$ layer interconnect. The first $M_{x+1}$ layer interconnect and the second $M_{x+1}$ layer interconnect are an output of the MOS device.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Interconnect resistance, especially with vias, is very high in the 7 nm node and smaller manufacturing processes. Bar vias (with approximately twice the width) can reduce the interconnect resistance, but using bar vias may not be possible in some standard cells due to predefined metal 1 (M1) layer, metal 2 (M2) layer, and metal 3 (M3) layer width and spacing. Even if using bar vias is possible, use of bar vias may require other non-desired design changes. Example MOS devices that reduce interconnect resistance without necessarily using bar vias are described infra (see FIGS. 3, 4, 5).

Figure 1:
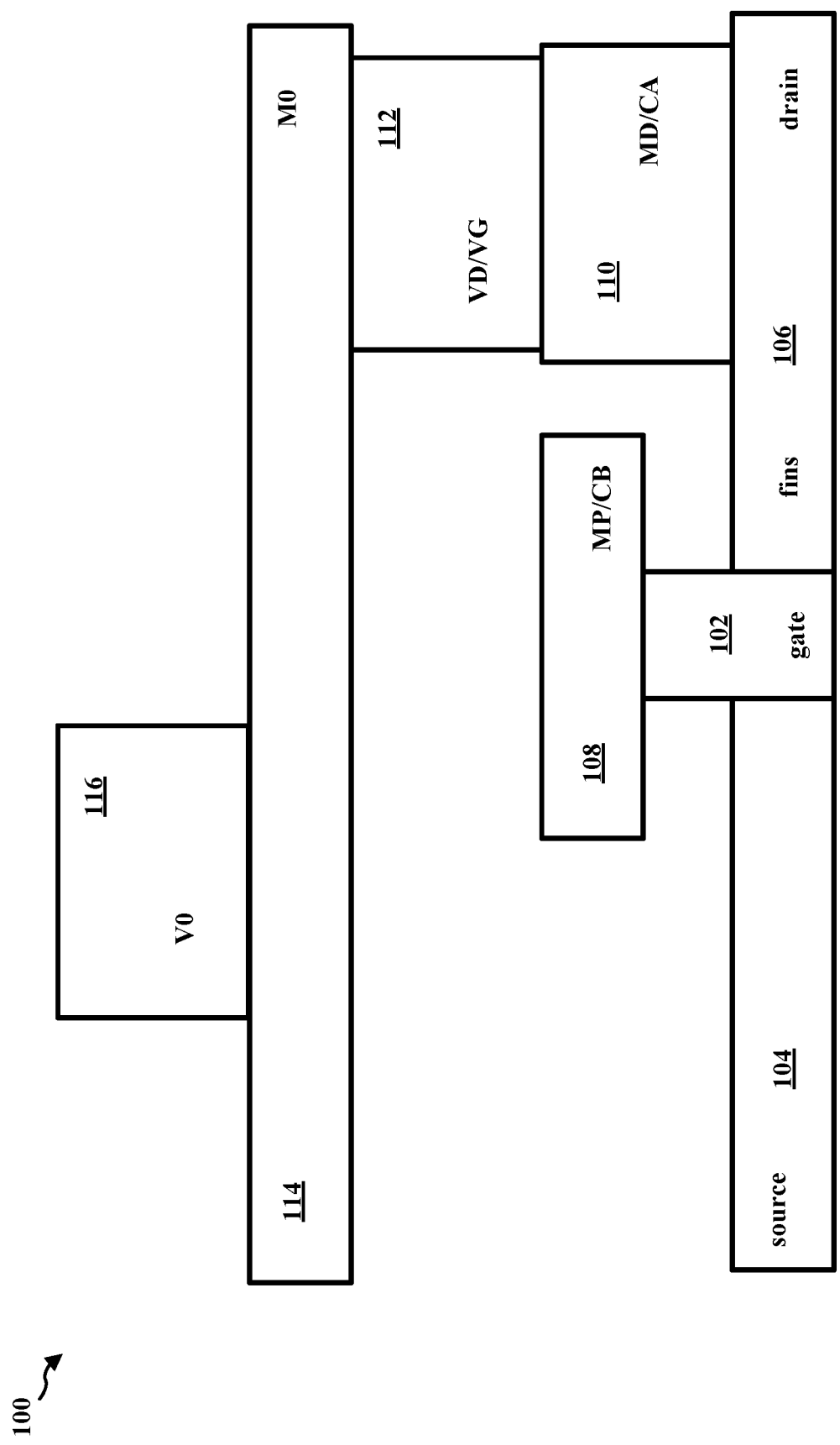
FIG. 1 is a first diagram illustrating a side view of various layers within a standard cell and IC.

FIG. 1 is a first diagram 100 illustrating a side view of various layers within a standard cell and IC. As illustrated in FIG. 1, a transistor has a gate 102, a source 104, and a drain 106. The source 104 and the drain 106 may be formed by fins. A contact B (CB) layer interconnect 108 (also referred to as a metal POLY (MP) layer interconnect) may contact the gate 102. A contact A (CA) layer interconnect 110 (also referred to as a metal diffusion (MD) layer interconnect) may contact the source 104 or the drain 106. A via 112 (referred to as via D (VD) or via G (VG)) may contact the CA layer interconnect 110. The vias VD, VG 112 are formed by separate masks in at least a double patterning process. A metal 0 (M0) layer interconnect 114 contacts the via VD/VG 112. A via V0 116 may contact the M0 layer interconnect 114.

Figure 2:
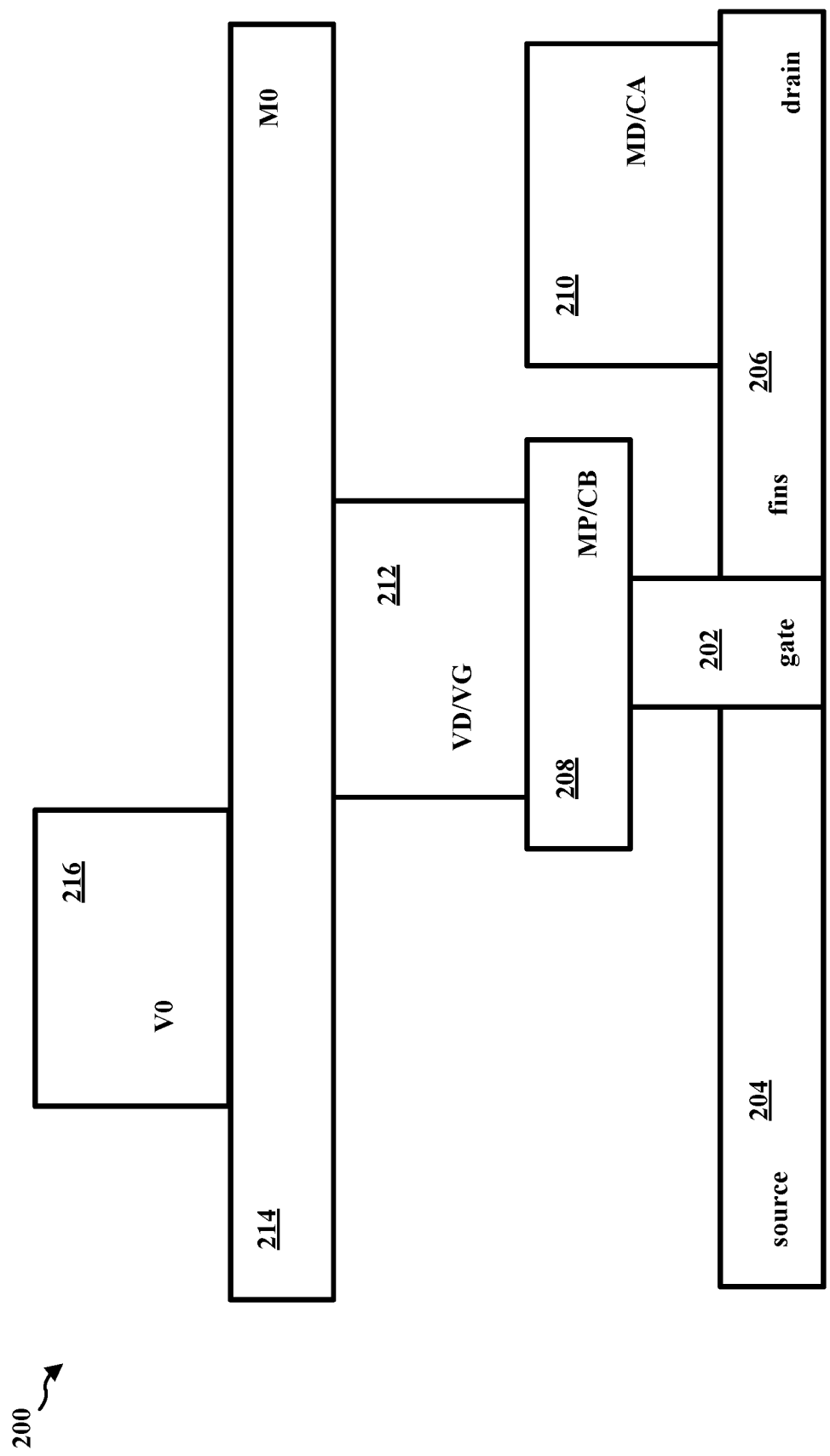
FIG. 2 is a second diagram illustrating a side view of various layers within a standard cell and IC.

FIG. 2 is a second diagram 200 illustrating a side view of various layers within a standard cell and IC. As illustrated in FIG. 2, a transistor has a gate 202, a source 204, and a drain 206. The source 204 and the drain 206 may be formed by fins. A CB layer interconnect 208 may contact the gate 202. A CA layer interconnect 210 may contact the source 204 or the drain 206. A via 212 VD/VG may contact the CB layer interconnect 208. An M0 layer interconnect 214 contacts the via VD/VG 212. A via V0 216 may contact the M0 layer interconnect 214.

Figure 3:
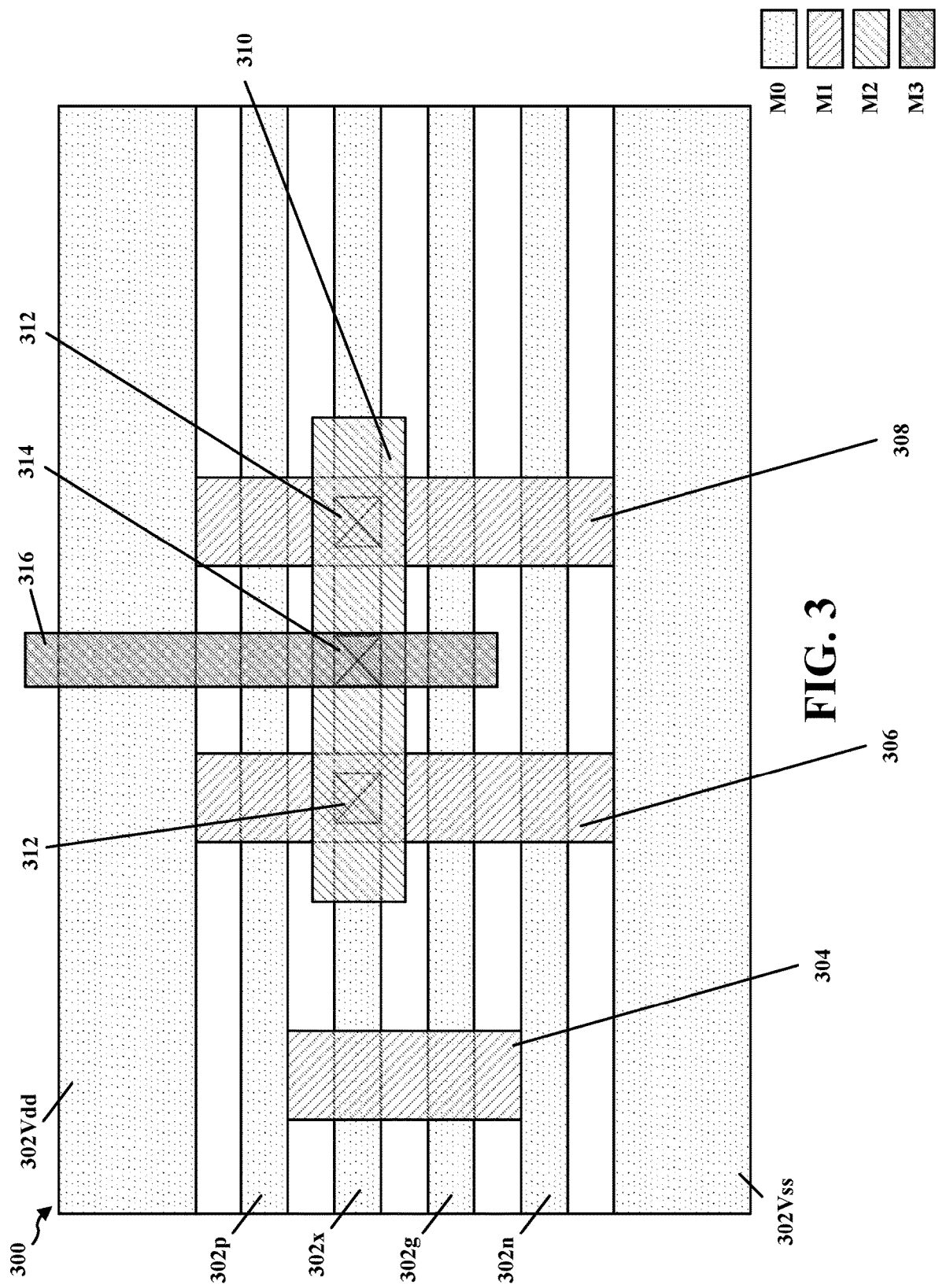
FIG. 3 is a diagram conceptually illustrating a plan view of a layout for a MOS device.

FIG. 3 is a diagram 300 conceptually illustrating a plan view of a layout for a MOS device. The MOS device is an inverter with an increased drive strength. The M0 layer interconnect 302Vdd provides a first voltage Vdd for powering the pMOS transistors. The M0 layer interconnect 302Vss provides a second voltage Vss for powering the nMOS transistors. The M0 layer interconnect 302p ties the pMOS drains together (e.g., see FIG. 1 with CA layer interconnects 110 and VD/VG vias 112). The M0 layer interconnect 302n ties the nMOS drains together (e.g., see FIG. 1 with CA layer interconnects 110 and VD/VG vias 112). The M0 layer interconnect 302g ties the pMOS and nMOS gates together (e.g., see FIG. 2 with CB layer interconnects 208 and VD/VG vias 212). The M0 layer interconnect 302x may be unconnected/uncoupled to the MOS device and may be included to fill in the open space, which may improve the yield during the manufacturing of the IC including the MOS device. The M1 layer interconnect 304 is an input (e.g., input pin) to the MOS device and is coupled to the M0 layer interconnect 302g. The M1 layer interconnect 306 is coupled to the M0 layer interconnect 302p and to the M0 layer interconnect 302n through vias V0 to tie the pMOS drains and the nMOS drains together. An additional M1 layer interconnect 308 is coupled to the M0 layer interconnect 302p and to the M0 layer interconnect 302n through vias V0 to tie the pMOS drains and the nMOS drains together. An M2 layer interconnect 310 is coupled to the M1 layer interconnects 306, 308 through the square vias V1 312. The M1 layer interconnects 306, 308, the M2 layer interconnect 310, and the corresponding via connections reduce an output resistance by providing two parallel current paths through the vias V1 312, the M1 layer interconnects 306, 308, and the vias V0 coupled to the M0 layer interconnects 302p, 302n. The output pin may be the M2 layer interconnect 310. During global routing, an M3 layer interconnect 316 may be coupled to the M2 layer interconnect 310 (output pin) through square via V2 314. The M3 layer interconnect 316 may be coupled to an input of another standard cell/MOS device. The MOS device has an improved drive strength as a result of the two parallel output current paths.

Figure 4:
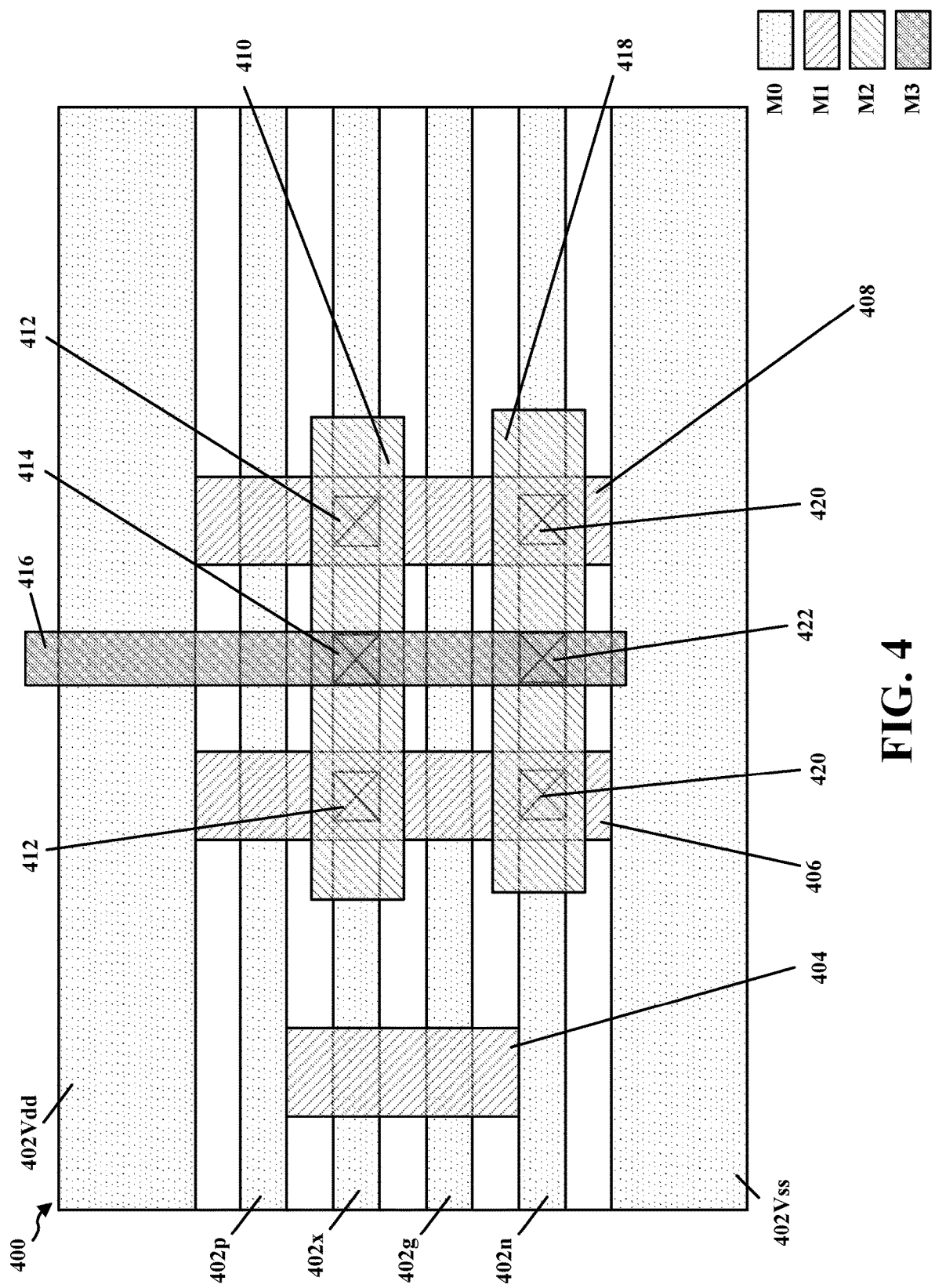
FIG. 4 is a diagram conceptually illustrating a plan view of a layout for an exemplary MOS device.

FIG. 4 is a diagram 400 conceptually illustrating a plan view of a layout for an exemplary MOS device. The MOS device is an inverter with an increased drive strength. The M0 layer interconnect 402Vdd provides a first voltage Vdd for powering the pMOS transistors. The M0 layer interconnect 402Vss provides a second voltage Vss for powering the nMOS transistors. The M0 layer interconnect 402p ties the pMOS drains together (e.g., see FIG. 1 with CA layer interconnects 110 and VD/VG vias 112). The M0 layer interconnect 402n ties the nMOS drains together (e.g., see FIG. 1 with CA layer interconnects 110 and VD/VG vias 112). The M0 layer interconnect 402g ties the pMOS and nMOS gates together (e.g., see FIG. 2 with CB layer interconnects 208 and VD/VG vias 212). The M0 layer interconnect 402x may be unconnected/uncoupled to the MOS device and may be included to fill in the open space, which may improve the yield during the manufacturing of the IC including the MOS device. The M1 layer interconnect 404 is an input (e.g., input pin) to the MOS device and is coupled to the M0 layer interconnect 402g. The M1 layer interconnect 406 is coupled to the M0 layer interconnect 402p and to the M0 layer interconnect 402n through vias V0 to tie the pMOS drains and the nMOS drains together. An additional M1 layer interconnect 408 is coupled to the M0 layer interconnect 402p and to the M0 layer interconnect 402n through vias V0 to tie the pMOS drains and the nMOS drains together. An M2 layer interconnect 410 is coupled to the M1 layer interconnects 406, 408 through the square vias V1 412. An additional M2 layer interconnect 418 is coupled to the M1 layer interconnects 406, 408 through the square vias V1 420. The M1 layer interconnects 406, 408, the M2 layer interconnects 410, 418, and the corresponding via connections reduce an output resistance by providing four parallel current paths through the M2 layer interconnects 410, 418, vias V1 412, 420, the M1 layer interconnects 406, 408, and the vias V0 coupled to the M0 layer interconnects 402p, 402n. The output pins may be the M2 layer interconnects 410, 418. Accordingly, a standard cell including the MOS device of FIG. 4 may have two separate output pins. During global routing, an M3 layer interconnect 416 may be coupled to the M2 layer interconnect 410 (first output pin) through square via V2 414 and to the M2 layer interconnect 418 (second output pin) through square via V2 422. The M3 layer interconnect 416 may be coupled to an input of another standard cell/MOS device. The MOS device has an improved drive strength as a result of the four parallel output current paths.

Figure 5:
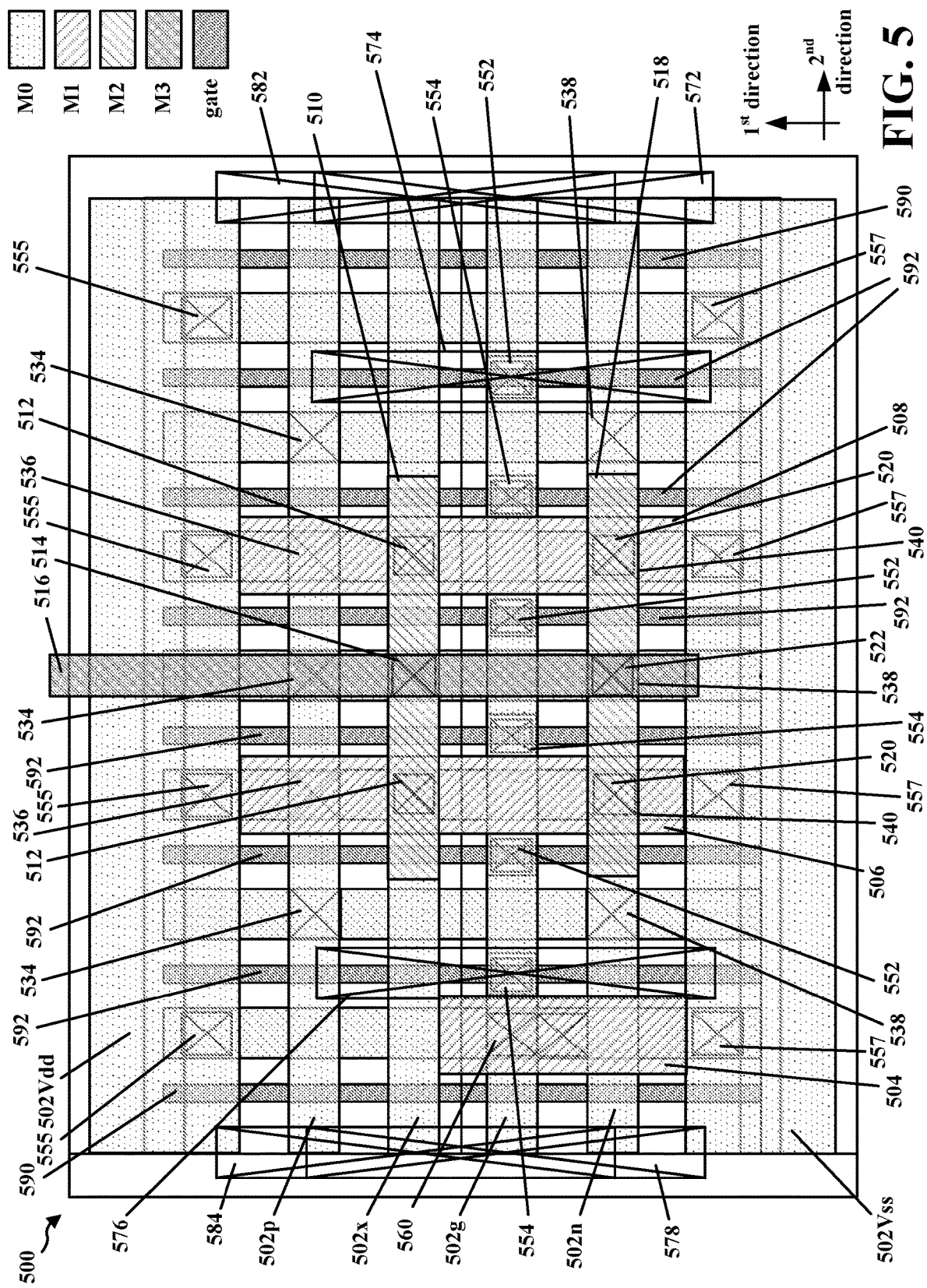
FIG. 5 is a diagram illustrating a plan view of a layout for the exemplary MOS device.

FIG. 5 is a diagram 500 illustrating a plan view of a layout for the exemplary MOS device. The MOS device is an inverter with an increased drive strength. The M0 layer interconnect 502Vdd provides a first voltage Vdd for powering the pMOS transistors. The M0 layer interconnect 502Vdd is coupled to the sources of the pMOS transistors through the vias VG 555 and CA layer interconnects (see FIG. 1). The M0 layer interconnect 502Vss provides a second voltage Vss for powering the nMOS transistors. The M0 layer interconnect 502Vss is coupled to the sources of the nMOS transistors through the vias VG 557 and CA layer interconnects (see FIG. 1). Gates of the pMOS transistors and the nMOS transistors are formed by gate interconnects 592. Dummy gate interconnects (that may be floating) may be located on the left and right sides of the standard cell. The M0 layer interconnect 502p ties the pMOS drains together through vias VD 534 (e.g., see FIG. 1 with CA layer interconnects 110 and VD/VG vias 112). The M0 layer interconnect 502n ties the nMOS drains together through vias VD 538 (e.g., see FIG. 1 with CA layer interconnects 110 and VD/VG vias 112). The M0 layer interconnect 502g ties the pMOS and nMOS gates together through the vias VD 552 and vias VG 554 (e.g., see FIG. 2 with CB layer interconnects 208 and VD/VG vias 212). As discussed supra, the vias VD 534, 538, 552 and the vias VG 554, 555, 557 are formed with different masks in a different patterning process. The M0 layer interconnect 502x may be unconnected/uncoupled to the MOS device and may be included to fill in the open space, which may improve the yield during the manufacturing of the IC including the MOS device. The M0 cuts 572, 574, 576, 578 cut the M0 layer interconnects 502n, 502x, and the M0 cuts 582, 584 cut the M0 layer interconnects 502p, 502g. The M0 cuts are handled during manufacturing and therefore the M0 layer interconnects 502x, 502n are split into three portions, two of which are floating (on the left and right sides). The M0 layer interconnects 502p, 502g are formed in a first patterning process with a first set of masks and the M0 layer interconnects 502x, 502n are formed in a second patterning process with a second set of masks. The M1 layer interconnect 504 is an input (e.g., input pin) to the MOS device and is coupled to the M0 layer interconnect 502g through via V0 560. The M1 layer interconnect 506 is coupled to the M0 layer interconnect 502p and to the M0 layer interconnect 502n through vias V0 536', 540', respectively, to tie the pMOS drains and the nMOS drains together. An additional M1 layer interconnect 508 is coupled to the M0 layer interconnect 502p and to the M0 layer interconnect 502n through vias V0 536", 540", respectively, to tie the pMOS drains and the nMOS drains together. An M2 layer interconnect 510 is coupled to the M1 layer interconnects 506, 508 through the square vias V1 512. An additional M2 layer interconnect 518 is coupled to the M1 layer interconnects 506, 508 through the square vias V1 520. The M1 layer interconnects 506, 508, the M2 layer interconnects 510, 518, and the corresponding via connections reduce an output resistance by providing four parallel current paths through the M2 layer interconnects 510, 518, vias V1 512, 520, the M1 layer interconnects 506, 508, and the vias V0 coupled to the M0 layer interconnects 502p, 502n. The output pins may be the M2 layer interconnects 510, 518. Accordingly, a standard cell including the MOS device of FIG. 5 may have two separate output pins. During global routing, an M3 layer interconnect 516 may be coupled to the M2 layer interconnect 510 (first output pin) through square via V2 514 and to the M2 layer interconnect 518 (second output pin) through square via V2 522. The M3 layer interconnect 516 may be coupled to an input of another standard cell/MOS device. The MOS device has an improved drive strength as a result of the four parallel output current paths.

Figure 6:
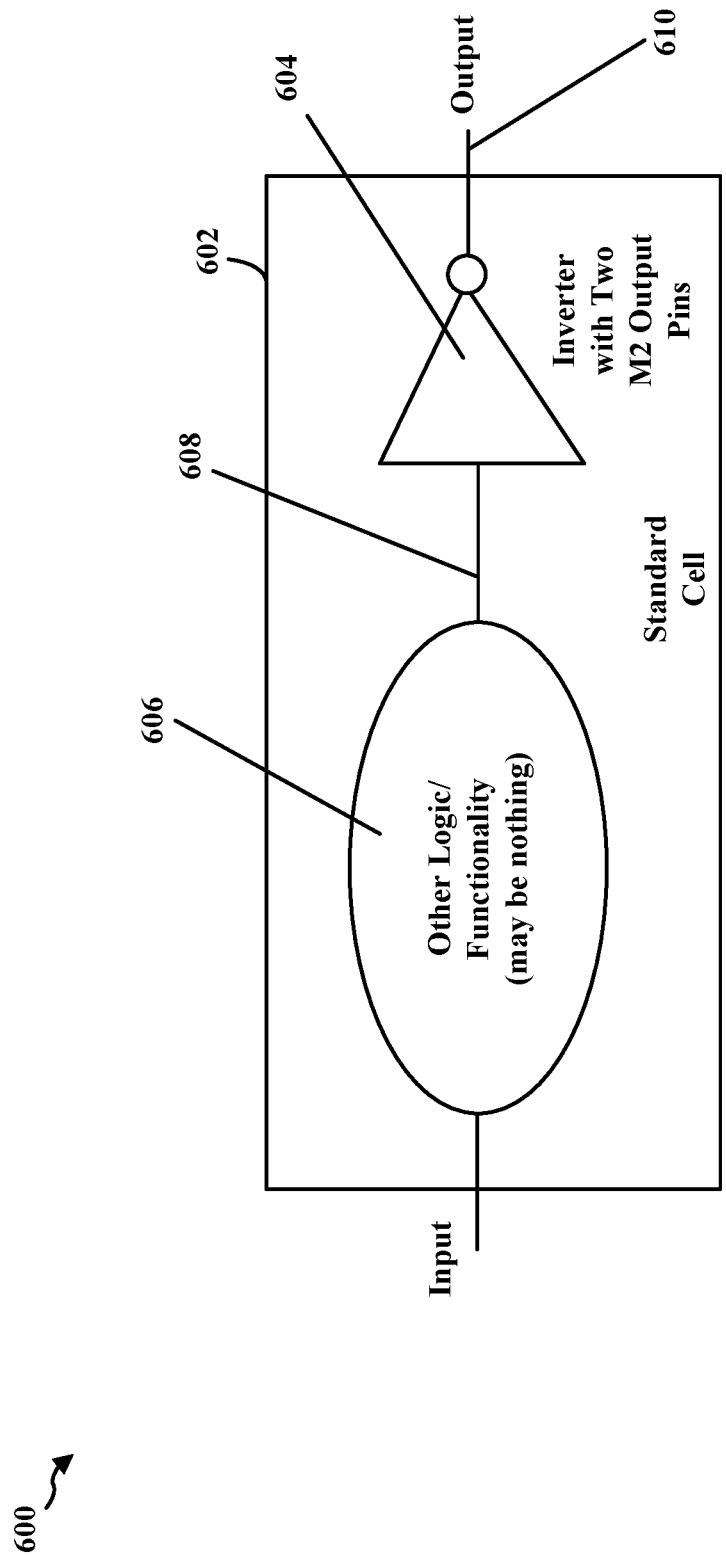
FIG. 6 is a diagram conceptually illustrating the exemplary MOS device in a standard cell.

FIG. 6 is a diagram 600 conceptually illustrating the exemplary MOS device in a standard cell. As shown in FIG. 6, a standard cell 602 includes an inverter 604. The inverter 604 may be the inverter conceptually illustrated in FIG. 4 and illustrated in FIG. 5. The input 608 of the inverter 604 corresponds to the input pins 404, 504. The output 610 of the inverter 604 corresponds to the M3 layer interconnects 416, 516 that connect the two output pins of the inverter conceptually illustrated in FIG. 4 and illustrated in FIG. 5. The standard cell 602 may include other logic/functionality 606. For example, the other logic/functionality 606 may be another inverter. Accordingly, the standard cell 602 may implement a buffer. As a higher drive strength is needed for the inverter 604 than an inverter 606, the inverter conceptually illustrated in FIG. 4 and illustrated in FIG. 5 may be used for the inverter 604.

Referring again to FIGS. 4, 5, 6, a MOS device of an IC includes a plurality of pMOS transistors, each having a pMOS transistor gate, a pMOS transistor drain, and a pMOS transistor source. Each pMOS transistor gate extends in a first direction. The MOS device further includes a plurality of nMOS transistors, each having an nMOS transistor gate, an nMOS transistor drain, and an nMOS transistor source. Each nMOS transistor gate extends in the first direction. Each nMOS transistor gate is formed with a corresponding pMOS transistor gate by a same gate interconnect 592 extending in the first direction. The MOS device further includes a first $M_x$ layer interconnect 406, 506 extending in the first direction and coupling the pMOS transistor drains to the nMOS transistor drains. The MOS device further includes a second $M_x$ layer interconnect 408, 508 extending in the first direction and coupling the pMOS transistor drains to the nMOS transistor drains. The second $M_x$ layer interconnect 408, 508 is parallel to the first $M_x$ layer interconnect 406, 506. The MOS device further includes a first $M_{x+1}$ layer interconnect 410, 510 extending in a second direction orthogonal to the first direction. The first $M_{x+1}$ layer interconnect 410, 510 is coupled to the first $M_x$ layer interconnect 406, 506 and the second $M_x$ layer interconnect 408, 508. The MOS device further includes a second $M_{x+1}$ layer interconnect 418, 518 extending in the second direction. The second $M_{x+1}$ layer interconnect 418, 518 is coupled to the first $M_x$ layer interconnect 406, 506 and the second $M_x$ layer interconnect 408, 508. The second $M_{x+1}$ layer interconnect 418, 518 is parallel to the first $M_{x+1}$ layer interconnect 410, 510. The first $M_{x+1}$ layer interconnect 410, 510 and the second $M_{x+1}$ layer interconnect 418, 518 are an output of the MOS device.

In one configuration, an $M_{x+2}$ layer interconnect 416, 516 extends in the first direction. The $M_{x+2}$ layer interconnect 416, 516 is coupled to the first $M_{x+1}$ layer interconnect 410, 510 and the second $M_{x+1}$ layer interconnect 418, 518. In one configuration, the MOS device is within a standard cell and the $M_{x+2}$ layer interconnect 416, 516 extends outside the standard cell to couple with an input of another standard cell. In one configuration, the $M_{x+2}$ layer interconnect 416, 516 is coupled to the first $M_{x+1}$ layer interconnect 410, 510 with a first via x+1 ($V_{x+1}$) via 414, 514 on a via x+1 layer, and is coupled to the second $M_{x+1}$ layer interconnect 418, 518 with a second $V_{x+1}$ via 422, 522 on the via x+1 layer. In one configuration, the MOS device is configured such that an output current flows through the first $V_{x+1}$ via 414, 514 and the second $V_{x+1}$ via 422, 522 to the $M_{x+2}$ layer interconnect 416, 516.

In one configuration, the first $M_{x+1}$ layer interconnect 410, 510 is coupled to the first $M_x$ layer interconnect 406, 506 with a first via x ($V_x$) via 412, 512 on a via x layer, and is coupled to the second $M_x$ layer interconnect 408, 508 with a second $V_x$ via 412, 512 on the via x layer. In such a configuration, the second $M_{x+1}$ layer interconnect 418, 518 is coupled to the first $M_x$ layer interconnect 406, 506 with a third $V_x$ via 420, 520 on the via x layer, and is coupled to the second $M_x$ layer interconnect 408, 508 with a fourth $V_x$ via 520 on the via x layer. In one configuration, the MOS device is configured such that an output current flows through the first $V_x$ via 412, 512 and the second $V_x$ via 412, 512 to the first $M_{x+1}$ layer interconnect 410, 510, and through the third $V_x$ via 420, 520 and the fourth $V_x$ via 420, 520 to the second $M_{x+1}$ layer interconnect 418, 518.

In one configuration, x is 1. In one configuration, the MOS device further includes a first $M_{x-1}$ layer interconnect 402p, 502p extending in the second direction and coupling the pMOS transistor drains together. The first $M_x$ layer interconnect 406, 506 and the second $M_x$ layer interconnect 408, 508 are coupled to the first $M_{x-1}$ layer interconnect 402p, 502p. In such a configuration, the MOS device further includes a second $M_{x-1}$ layer interconnect 402n, 502n extending in the second direction and coupling the nMOS transistor drains together. The first $M_x$ layer interconnect 406, 506 and the second $M_x$ layer interconnect 408, 508 are coupled to the second $M_{x-1}$ layer interconnect 402n, 502n. In one configuration, the MOS device further includes a third $M_{x-1}$ layer interconnect 402g, 502g extending in the second direction and coupling the pMOS transistor gates and the nMOS transistor gates together.

In one configuration, the MOS device operates as an inverter. In one configuration, the MOS device is within a standard cell, the first $M_{x+1}$ layer interconnect 410, 510 is a first output pin of the standard cell, and the second $M_{x+1}$ layer interconnect 418, 518 is a second output pin of the standard cell.

Figure 7:
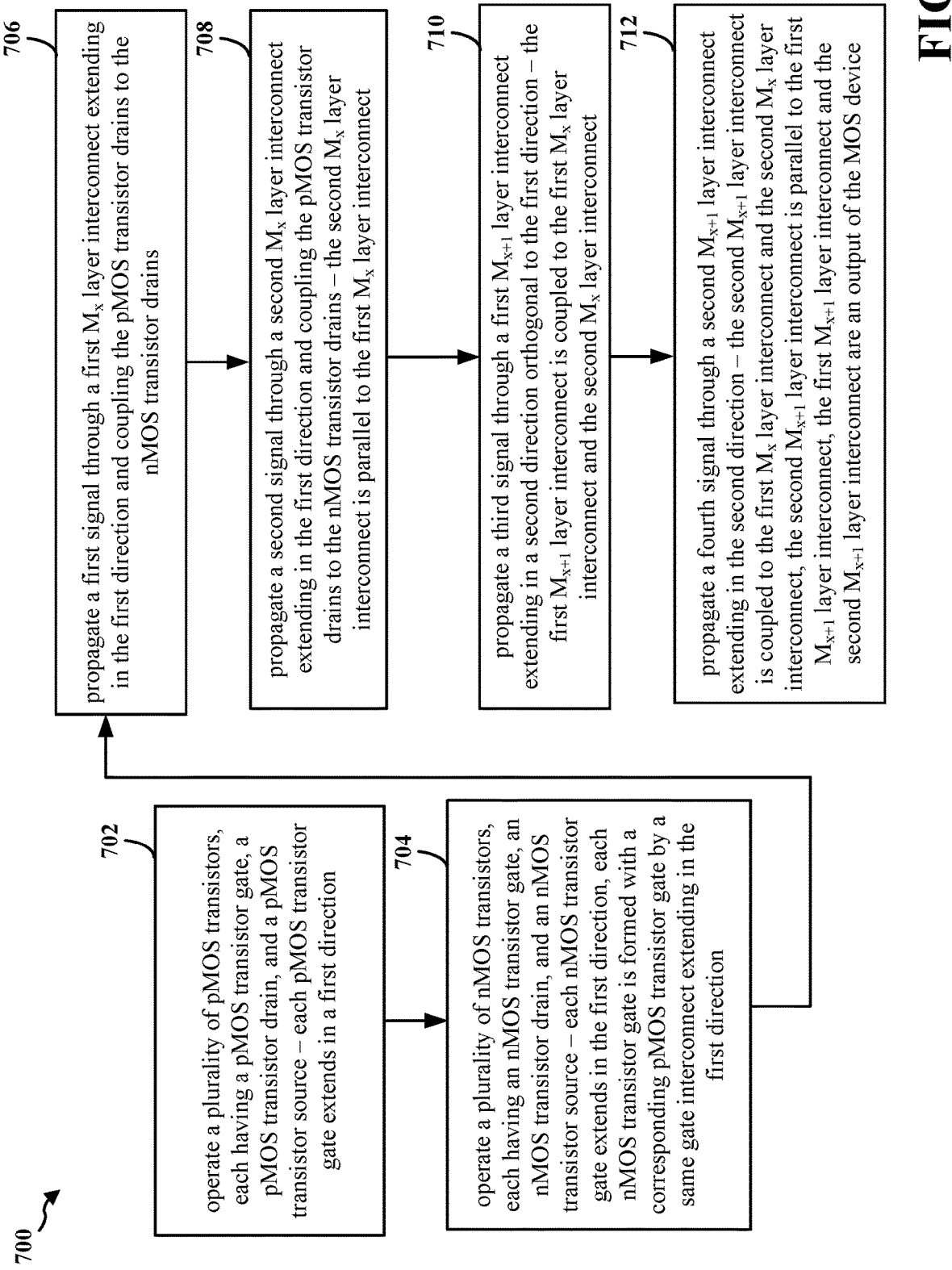
FIG. 7 is a diagram illustrating a method of operation the exemplary MOS device.

FIG. 7 is a diagram illustrating a method of operation the exemplary MOS device. As illustrated in FIG. 7, at 702, a plurality of pMOS transistors are operated. Each pMOS transistor has a pMOS transistor gate, a pMOS transistor drain, and a pMOS transistor source. Each pMOS transistor gate extends in a first direction. At 704, a plurality of nMOS transistors are operating. Each nMOS transistor has an nMOS transistor gate, an nMOS transistor drain, and an nMOS transistor source. Each nMOS transistor gate extends in the first direction. Each nMOS transistor gate is formed with a corresponding pMOS transistor gate by a same gate interconnect 592 extending in the first direction. At 706, a first signal is propagated through a first $M_x$ layer interconnect 406, 506 extending in the first direction and coupling the pMOS transistor drains to the nMOS transistor drains. At 708, a second signal is propagated through a second $M_x$ layer interconnect 408, 508 extending in the first direction and coupling the pMOS transistor drains to the nMOS transistor drains. The second $M_x$ layer interconnect 408, 508 is parallel to the first $M_x$ layer interconnect 406, 506. At 710, a third signal is propagated through a first $M_{x+1}$ layer interconnect 410, 510 extending in a second direction orthogonal to the first direction. The first $M_{x+1}$ layer interconnect 410, 510 is coupled to the first $M_x$ layer interconnect 406, 506 and the second $M_x$ layer interconnect 408, 508. At 712, a fourth signal is propagated through a second $M_{x+1}$ layer interconnect 418, 518 extending in the second direction. The second $M_{x+1}$ layer interconnect 418, 518 is coupled to the first $M_x$ layer interconnect 406, 506 and the second $M_x$ layer interconnect 408, 508. The second $M_{x+1}$ layer interconnect 418, 518 is parallel to the first $M_{x+1}$ layer interconnect 410, 510. The first $M_{x+1}$ layer interconnect 410, 510 and the second $M_{x+1}$ layer interconnect 418, 518 are an output of the MOS device.

Referring again to FIGS. 4, 5, 6, a MOS device of an IC includes a plurality of pMOS transistors, each having a pMOS transistor gate, a pMOS transistor drain, and a pMOS transistor source. Each pMOS transistor gate extends in a first direction. The MOS device further includes a plurality of nMOS transistors, each having an nMOS transistor gate, an nMOS transistor drain, and an nMOS transistor source. Each nMOS transistor gate extends in the first direction. Each nMOS transistor gate is formed with a corresponding pMOS transistor gate by a same gate interconnect 592 extending in the first direction. The MOS device further includes a first $M_x$ layer interconnect 406, 506 extending in the first direction and coupling the pMOS transistor drains to the nMOS transistor drains. The MOS device further includes a second $M_x$ layer interconnect 408, 508 extending in the first direction and coupling the pMOS transistor drains to the nMOS transistor drains. The second $M_x$ layer interconnect 408, 508 is parallel to the first $M_x$ layer interconnect 406, 506. The MOS device further includes a first $M_{x+1}$ layer interconnect 410, 510 extending in a second direction orthogonal to the first direction. The first $M_{x+1}$ layer interconnect 410, 510 is coupled to the first $M_x$ layer interconnect 406, 506 and the second $M_x$ layer interconnect 408, 508. The MOS device further includes means for propagating a signal 418, 518. The means for propagating a signal 418, 518 extends in the second direction. The means for propagating a signal 418, 518 is coupled to the first $M_x$ layer interconnect 406, 506 and the second $M_x$ layer interconnect 408, 508. The means for propagating a signal 418, 518 is parallel to the first $M_{x+1}$ layer interconnect 410, 510. The first $M_{x+1}$ layer interconnect 410, 510 and the means for propagating a signal 418, 518 are an output of the MOS device. The means for propagating a signal 418, 518 may be a second $M_{x+1}$ layer interconnect 418, 518.

As discussed supra, a standard cell including an inverter is provided in FIGS. 4, 5 that includes four parallel output paths from the pMOS and nMOS drains of the inverter. The four parallel output paths reduce the effective via interconnect resistance at the output. The square via resistance is approximately halved, as either the pMOS transistors or the nMOS transistors are operating at one time. Via resistance may be further reduced by the use of bar vias, assuming layout constraints would allow use of such bar vias.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) device of an integrated circuit (IC), comprising:
   a plurality of p-type MOS (pMOS) transistors, each having a pMOS transistor gate, a pMOS transistor drain, and a pMOS transistor source, each pMOS transistor gate extending in a first direction;
   a plurality of n-type MOS (nMOS) transistors, each having an nMOS transistor gate, an nMOS transistor drain, and an nMOS transistor source, each nMOS transistor gate extending in the first direction;
   a first metal x ($M_x$) layer interconnect extending in the first direction and coupling the pMOS transistor drains to the nMOS transistor drains;
   a second $M_x$ layer interconnect extending in the first direction and coupling the pMOS transistor drains to the nMOS transistor drains, the second $M_x$ layer interconnect being parallel to the first $M_x$ layer interconnect;

a first metal x+1 ($M_{x+1}$) layer interconnect extending in a second direction orthogonal to the first direction, the first $M_{x+1}$ layer interconnect being coupled to the first $M_x$ layer interconnect and the second $M_x$ layer interconnect; and means for propagating a signal, the means for propagating a signal extending in the second direction, the means for propagating a signal being coupled to the first $M_x$ layer interconnect and the second $M_x$ layer interconnect, the means for propagating a signal being parallel to the first $M_{x+1}$ layer interconnect, the first $M_{x+1}$ layer interconnect and the means for propagating a signal being an output of the MOS device.

2. The MOS device of claim 1, wherein the means for propagating a signal is a second $M_{x+1}$ layer interconnect.

3. The MOS device of claim 2, further comprising a metal x+2 ($M_{x+2}$) layer interconnect extending in the first direction, the $M_{x+2}$ layer interconnect being coupled to the first $M_{x+1}$ layer interconnect and the second $M_{x+1}$ layer interconnect.

4. The MOS device of claim 2, wherein the first $M_{x+1}$ layer interconnect is coupled to the first $M_x$ layer interconnect with a first via x ($V_x$) via on a via x layer, and is coupled to the second $M_x$ layer interconnect with a second $V_x$ via on the via x layer, and wherein the second $M_{x+1}$ layer interconnect is coupled to the first $M_x$ layer interconnect with a third $V_x$ via on the via x layer, and is coupled to the second $M_x$ layer interconnect with a fourth $V_x$ via on the via x layer.

5. The MOS device of claim 2, wherein x is 1.

6. The MOS device of claim 2, further comprising:

a first metal x−1 ($M_{x-1}$) layer interconnect extending in the second direction and coupling the pMOS transistor drains together, the first $M_x$ layer interconnect and the second $M_x$ layer interconnect being coupled to the first $M_{x-1}$ layer interconnect; and a second $M_{x-1}$ layer interconnect extending in the second direction and coupling the nMOS transistor drains together, the first $M_x$ layer interconnect and the second $M_x$ layer interconnect being coupled to the second $M_{x-1}$ layer interconnect.

7. The MOS device of claim 2, wherein the MOS device is within a standard cell, the first $M_{x+1}$ layer interconnect is a first output pin of the standard cell, and the second $M_{x+1}$ layer interconnect is a second output pin of the standard cell.

8. A method of operation of a metal oxide semiconductor (MOS) device of an integrated circuit (IC), comprising:

operating a plurality of p-type MOS (pMOS) transistors, each having a pMOS transistor gate, a pMOS transistor drain, and a pMOS transistor source, each pMOS transistor gate extending in a first direction;

operating a plurality of n-type MOS (nMOS) transistors, each having an nMOS transistor gate, an nMOS transistor drain, and an nMOS transistor source, each nMOS transistor gate extending in the first direction;

propagating a first signal through a first metal x ($M_x$) layer interconnect extending in the first direction and coupling the pMOS transistor drains to the nMOS transistor drains;

propagating a second signal through a second $M_x$ layer interconnect extending in the first direction and coupling the pMOS transistor drains to the nMOS transistor drains, the second $M_x$ layer interconnect being parallel to the first $M_x$ layer interconnect;

propagating a third signal through a first metal x+1 ($M_{x+1}$) layer interconnect extending in a second direction orthogonal to the first direction, the first $M_{x+1}$ layer interconnect being coupled to the first $M_x$ layer interconnect and the second $M_x$ layer interconnect; and propagating a fourth signal through a second $M_{x+1}$ layer interconnect extending in the second direction, the second $M_{x+1}$ layer interconnect being coupled to the first $M_x$ layer interconnect and the second $M_x$ layer interconnect, the second $M_{x+1}$ layer interconnect being parallel to the first $M_{x+1}$ layer interconnect, the first $M_{x+1}$ layer interconnect and the second $M_{x+1}$ layer interconnect being an output of the MOS device.

* * * * *